United States Patent
Zortea

(10) Patent No.: US 8,952,835 B1
(45) Date of Patent: *Feb. 10, 2015

(54) BACKGROUND CALIBRATION OF APERTURE CENTER ERRORS IN ANALOG TO DIGITAL CONVERTERS

(71) Applicant: PMC-Sierra US, Inc., Sunnyvale, CA (US)

(72) Inventor: Anthony Eugene Zortea, Pipersville, PA (US)

(73) Assignee: PMC-Sierra US, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/336,205

(22) Filed: Jul. 21, 2014

Related U.S. Application Data

(63) Continuation of application No. 13/766,948, filed on Feb. 14, 2013, now Pat. No. 8,810,442.

(51) Int. Cl.
*H03M 1/08* (2006.01)

(52) U.S. Cl.
CPC .......... *H03M 1/0836* (2013.01); *H03M 1/0809* (2013.01)
USPC .......................................... 341/120; 341/118

(58) Field of Classification Search
None
See application file for complete search history.

(56) References Cited

U.S. PATENT DOCUMENTS

| | | | |
|---|---|---|---|
| 4,380,005 | A | 4/1983 | Debord et al. |
| 6,900,750 | B1 | 5/2005 | Nairn |
| 6,970,528 | B2 | 11/2005 | Pearson |
| 7,064,693 | B1 | 6/2006 | Huang et al. |
| 7,161,523 | B1 | 1/2007 | Zortea |
| 7,253,762 | B2 | 8/2007 | Huang et al. |
| 7,271,757 | B2 | 9/2007 | Nakamoto et al. |
| 7,394,413 | B2 | 7/2008 | Batruni |
| 7,622,987 | B1 | 11/2009 | Zortea |
| 7,623,050 | B2 | 11/2009 | Le et al. |
| 7,741,982 | B2 | 6/2010 | Johansson et al. |
| 7,839,313 | B2 | 11/2010 | Kidambi |
| 8,115,662 | B2 | 2/2012 | Anthony |
| 8,611,473 | B1 | 12/2013 | Warner |
| 2008/0211702 | A1 | 9/2008 | Iorgulescu |
| 2010/0117876 | A1 | 5/2010 | Cao et al. |

OTHER PUBLICATIONS

Agazzi et al., "Background Calibration of Interleaved Analog to Digital Converters for High-Speed communications Using Interleaved Timing Recovery Techniques", Circuits and Systems, ISCAS, IEEE International Symposium on Circuits and Systems, May 23-25, 2005, vol. 2, pp. 1390-1393, Irvine, California, USA.

Huang et al., "A Statistical Background Calibration Technique for Flash Analog-to-Digital Converters", Circuits and Systems, ISCAS, IEEE International Symposium on Circuits and Systems, May 23-26, 2004, vol. 1, pp. I-125 to 128, Hsin-Chu, Taiwan.

(Continued)

*Primary Examiner* — Howard Williams
(74) *Attorney, Agent, or Firm* — Dennis R. Haszko

(57) ABSTRACT

A method of background calibration of aperture center errors in a data communication system is provided. In an implementation, in response to detection of a low sampler output ("0") in between two high sampler outputs ("1"), the method includes: determining a direction of an ADC output signal at the time of the detected low output; and adjusting timing at a selected sampler based on the determined signal direction. In an example implementation, the method includes watching for bubbles in the thermometer code output, and estimating the first derivative of the signal at the time of the bubble, then estimating the sign of the errors. In an example implementation, the errors are used in a control loop to reduce the aperture center error.

21 Claims, 12 Drawing Sheets

(56) References Cited

OTHER PUBLICATIONS

Tsimbinos et al., "Improved error-table compensation of A/D converters" IEE Proc.—Circuits Devices Syst., vol. 144, No. 6, Dec. 1997.

Nuzzo et al., Efficient Calibration through Statistical Behavioral Modeling of a High-Speed Low-Power ADC, 2006, IEEE, Research in Microelectronics and Electronics 2006, PhD, pp. 297-300, Print ISBN:1-4244-0157-7, INSPEC Accession No. 9145412.

Nikaeen et al., Digital Compensation of Dynamic Acquisition Errors at the Front-End of High-Performance A/D Converters, IEEE Journal of Selected Topics in Signal Processing, vol. 3, Jun. 2009, pp. 499-508.

US 8,952,835 B1

BACKGROUND CALIBRATION OF APERTURE CENTER ERRORS IN ANALOG TO DIGITAL CONVERTERS

CROSS-REFERENCE TO RELATED APPLICATIONS

The present application is a continuation of U.S. patent application Ser. No. 13/766,948 filed on Feb. 14, 2013, which is related to commonly assigned U.S. patent application Ser. No. 13/766,855 filed on Feb. 14, 2013 entitled "Background Calibration of Threshold Errors in Analog to Digital Converters," both of which are incorporated herein by reference in their entirety.

FIELD

The present disclosure relates generally to analog to digital converters (ADCs) that are used in data communications, for example serializer/deserializer (SerDes) and optical transceivers. More particularly, the present disclosure relates to aperture center calibration in such data communications.

BACKGROUND

A flash ADC comprises a set of comparators, each with a different threshold. For ADC comparators, the thresholds are normally linearly spaced with respect to each other, although this constraint is not necessary. An important constraint is that the thresholds be known to the downstream digital signal processor (DSP). For a bank of comparators arranged such that they are evenly and linearly spaced, such that the threshold voltage between any two thresholds is the same, the quality of the data conversion depends on the linearity of that spacing. An example implementation with 16 threshold levels would provide a data convertor of 4 bits (since $2^4=16$). This would require 16 evenly spaced thresholds. If the thresholds are not evenly spaced, the effective resolution of ADC is lower than 16.

Often, the comparator set is preceded by a single sample and hold circuit, which samples the input signal and holds its output while the comparators make the comparison to their respective thresholds.

The "hold" cycle of a sample and hold circuit is imperfect in the sense that the output signal may still be changing at the input to the comparators, particularly for very high speed flash ADCs. Other flash ADCs forego the sample and hold, which virtually guarantees that the signal will be changing while the comparators are making their decision.

The comparators in an ADC are normally clocked; such comparators are also referred to herein as "samplers". Ideally each sampler samples the input signal at the same instant. The samplers are analog circuits whose ideal input-output relationship can be described as:

$$\text{output}_k(iT) = \text{sign}(\text{input}(iT) - \text{threshold}_k) \quad \text{Equation 1}$$

where i is the sample index (the ith sample), and T is the sampling period and k is the kth comparator in a set of comparators.

However the real-life, or non-ideal, behavior of the sampler and sample and hold circuit introduces a threshold offset, and a sampling time offset, thereby distorting the kth sampler as shown below.

$$\text{output}_k(iT) = \text{sign}(\text{input}(iT + \text{apertureError}_k) - \text{threshold}_k + \text{offset}_k) \quad \text{Equation 2}$$

where apertureError$_k$ is the timing error of the kth sampler. The aperture timing error can in general be different for each sampler. In the present disclosure, the "common mode" aperture error is the average of all the individual aperture errors, and the "differential mode" aperture error is the difference between any two aperture sampling times.

It is desirable to remove the effect of apertureError$_k$ and offset$_k$ with calibration. The present disclosure addresses apertureError$_k$.

There are two categories of calibration: foreground and background. Foreground calibration refers to a procedure performed in such a way as to disrupt the normal signal flow through the ADC, often by temporarily removing the normal ADC input signal and introducing a known calibration input signal. By doing so, during foreground calibration the system in which the ADC is performing the data conversion is not able to process the normal input signal. This disruption can sometimes be tolerated at certain times in the life cycle of the system with the ADC, perhaps for a brief time at power up.

Background calibration refers to a calibration procedure in which the normal signal flow of the system with the ADC is not disrupted in any way; the system can continue to process data from the ADC and expect the conversion performance to be within specified bounds, and expect that the normal input signal is being converted.

In an implementation, a flash ADC is a single set of comparators which all sample the input signal at the same instant. Such an ADC implementation is shown in FIG. 1A. Very high speed flash ADCs often employ "time-interleaving" in which a total flash ADC comprises several time-interleaved sub-ADCs, as shown in FIG. 1B which illustrates a two-phase interleaved flash. In an example using time-interleaved sub-ADCs, as shown in FIG. 1B, each sub-ADC comprises a set of comparators running off a different phase of a lower speed clock. Time-interleaving allows samplers to run off of a slower clock while maintaining the higher speed net sampling frequency.

Recall the input-output relationship of an analog sampler:

$$\text{output}_k(iT) = \text{sign}(\text{input}(iT + \text{apertureError}_k) - \text{threshold}_k + \text{offset}_k) \quad \text{Equation 3}$$

Estimating and calibrating the offsetk is the subject of the related commonly assigned U.S. patent application Ser. No. 13/766,855 (Attorney Ref. PAT 7079-2) entitled "Background Calibration of Threshold Errors in Analog to Digital Converters".

It is desirable to estimate and reduce apertureError$_k$.

FIG. 2 illustrates a grid 10 as a representation of a time-interleaved flash ADC, in which time is on the horizontal axis and threshold amplitude is on the vertical axis. Ideally, voltage is spaced linearly or vertically, as shown by the ideal times and amplitudes 12 in FIG. 2. However, since it is also desirable to have the comparators spaced linearly in time (to achieve time-interleaving), which is shown horizontally, the threshold voltage would be interleaved. The horizontal spacing stands for when the sample occurs, which is also shown in FIG. 2.

FIG. 3 illustrates the impact of threshold errors due to sampler offsets. The measured values 14 include threshold errors, and move up and down with respect to the ideal values 12; the measured values 14 are not evenly spaced, and require correction.

FIG. 4 illustrates the impact of both threshold and aperture timing errors by illustrating measured values 16 which include threshold and aperture center errors. The aperture timing errors are represented in the values 16 by a shift to the left and right with respect to the ideal. For a given column of samplers, it is desirable that all samplers sample at the same time. Because the input signal could be changing, if samples are taken too early or too late with respect to the ideal value, this can result in not properly representing the analog signal at a given time, which is undesirable.

As shown in FIG. 5, a problem arises when an analog signal 18 passes between the measured timing instants, or measured values, 16 of two samplers. FIG. 5 illustrates that there could be a problem if the samples are not sampling at the same instant, which is illustrated as lined up horizontally. If the analog signal happens to slip in between two of the measured values 16 as shown, this results in an error as shown in FIG. 6.

FIG. 6 illustrates the output of the individual samplers in the scenario of FIG. 5, showing occurrence of a "sparkle code" or "bubble", which is defined as a 0 between two 1s. In FIG. 6, ideal values 20 are the output of the ideal sampler, while measured values 22 are the measured output of a real sampler, including amplitude and aperture timing errors. The sampler output should be a 1 if the analog signal is above the threshold, and the output should be 0 if the analog signal is below the threshold.

In FIG. 6, the ideal sampler output values at samplers 24 and 26 are 1. The ideal output value at sampler 28 is 0, since the analog signal 18 is below the ideal threshold 12. This indicates that, based on ideal sampler outputs 20, the analog signal 18 crosses the threshold between samplers 26 and 28. When samplers are horizontally perfectly timed, the observed output is always a set of 1s at the bottom and a set of 0s at the top.

In FIG. 6, the measured sampler value at sampler 24 is a 1. At sampler 26, since the measured value 16 is offset "earlier" in time with respect to the ideal value 12, the threshold output is 0, even though it should ideally have been 1. At sampler 28, since the measured value 16 is offset "later" in time with respect to the ideal value 12, the threshold output is 1, even though it should ideally have been 0. At the subsequent samplers in FIG. 6, the ideal and real outputs are the same.

As illustrated in FIG. 6, sampler outputs with aperture and timing errors can produce an error called a bubble code or a sparkle code, which is a 0 observed in between two 1 s at the output. In such cases, there is some confusion based on the output.

After the occurrence of bubbles has been identified, there are some known approaches regarding what to do about the bubble. In one approach, the two comparators are identified between which the analog signal falls, such as observing when the comparator goes from a 1 to 0. However, in the example of FIGS. 5 and 6, since the transition from a 1 to 0 is a gentle one, such an approach would result in an incorrect or erroneous determination. Also, if there is more than one transition from 1s to 0s, a decision must be made as to which transition is the "proper" transition.

Another approach is to add up the number of 1s, which then provides an identification of the comparator above which the analog signal above was observed to make the transition. However, even in this case, this is just an estimate.

In these known approaches, bubbles are dealt with by making a choice; but, at any time, the choices will sometimes be right and sometimes be wrong.

It is desirable to provide an alternative approach to correcting aperture center errors, which reduces or eliminates the occurrences of bubbles.

BRIEF DESCRIPTION OF THE DRAWINGS

Embodiments of the present disclosure will now be described, by way of example only, with reference to the attached Figures.

DETAILED DESCRIPTION

Figure 1A:
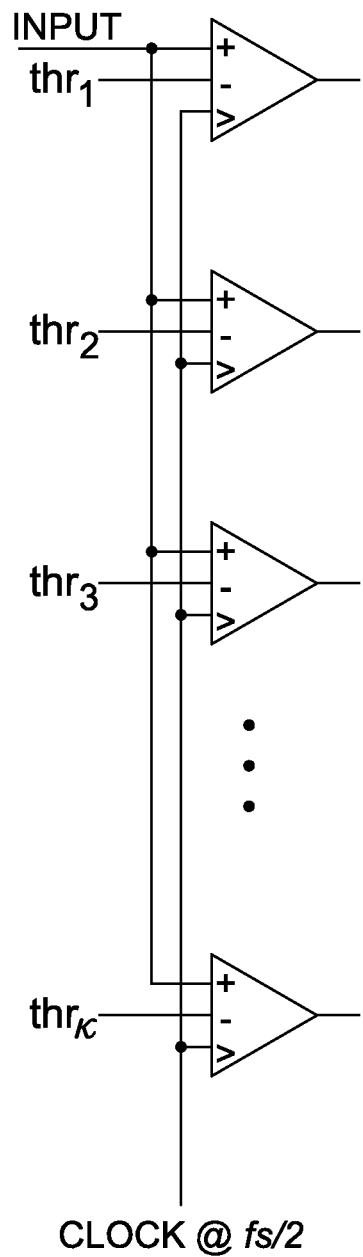
FIGS. 1A and 1B illustrate example comparator arrangements in non-time-interleaved and time-interleaved flash ADCs, respectively.
Figure 1B:
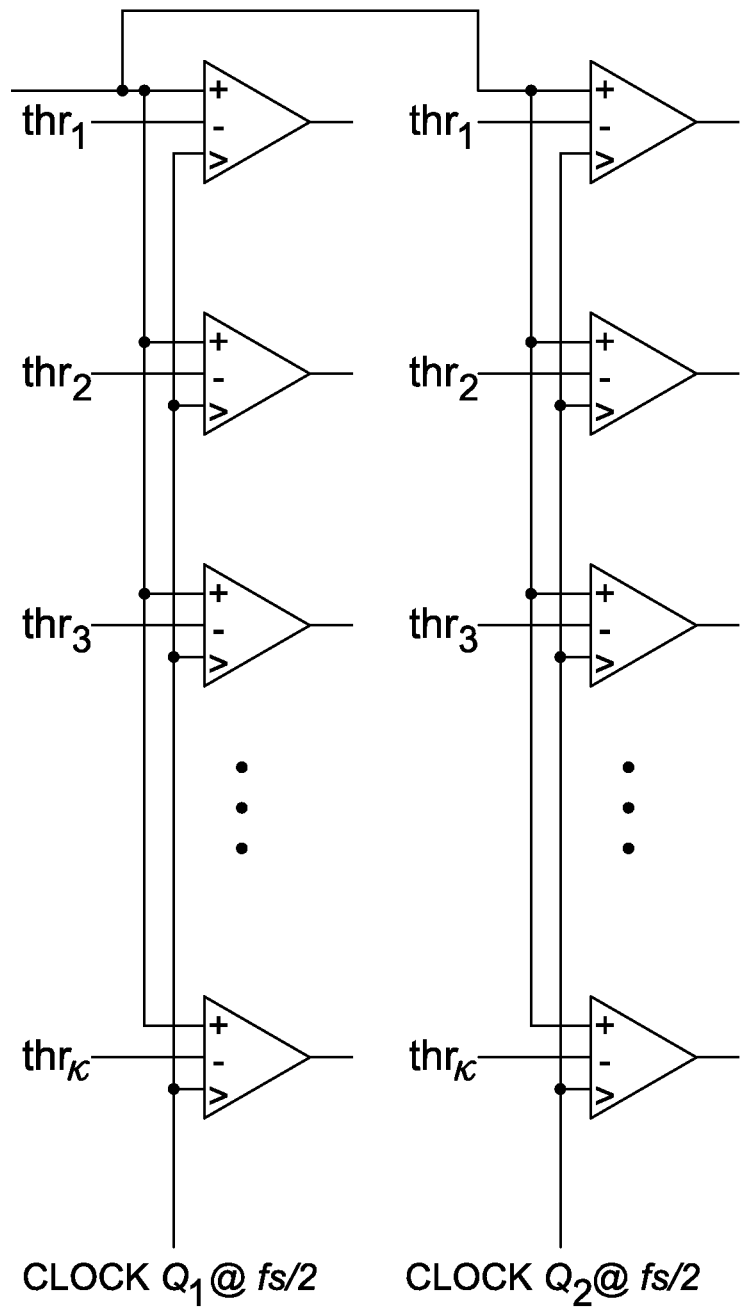
Figure 2:
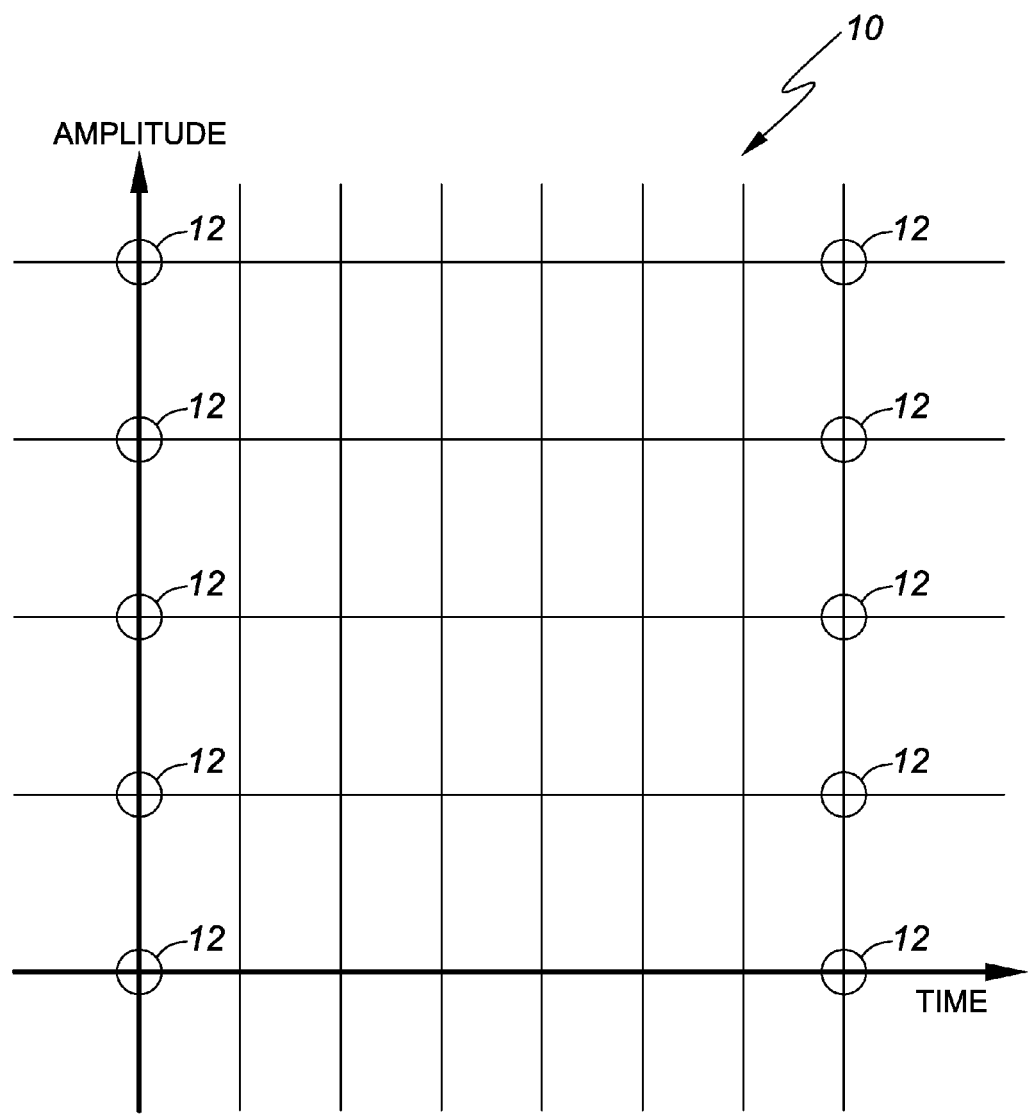
FIG. 2 illustrates representation of a time-interleaved flash ADC.
Figure 3:
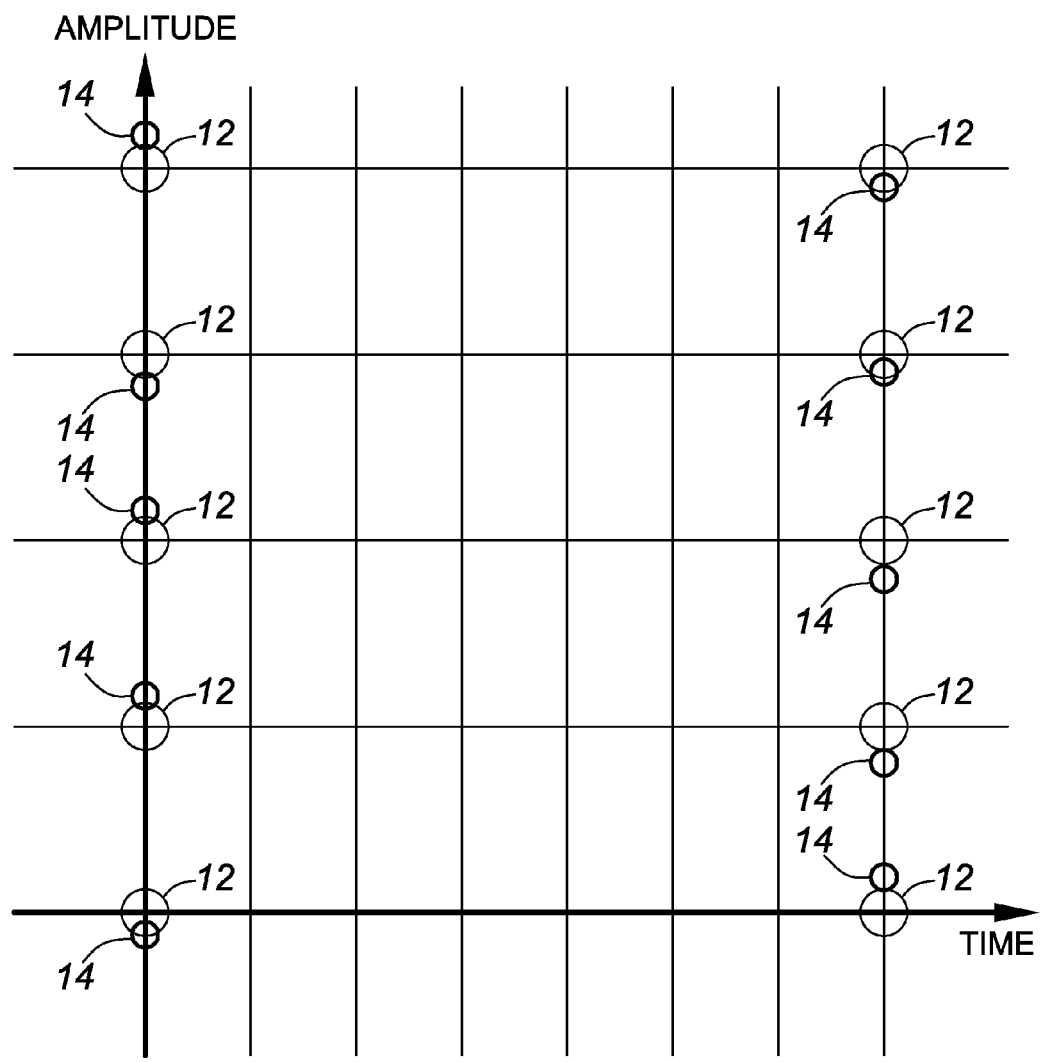
FIG. 3 illustrates the impact of threshold errors due to sampler offsets.
Figure 4:
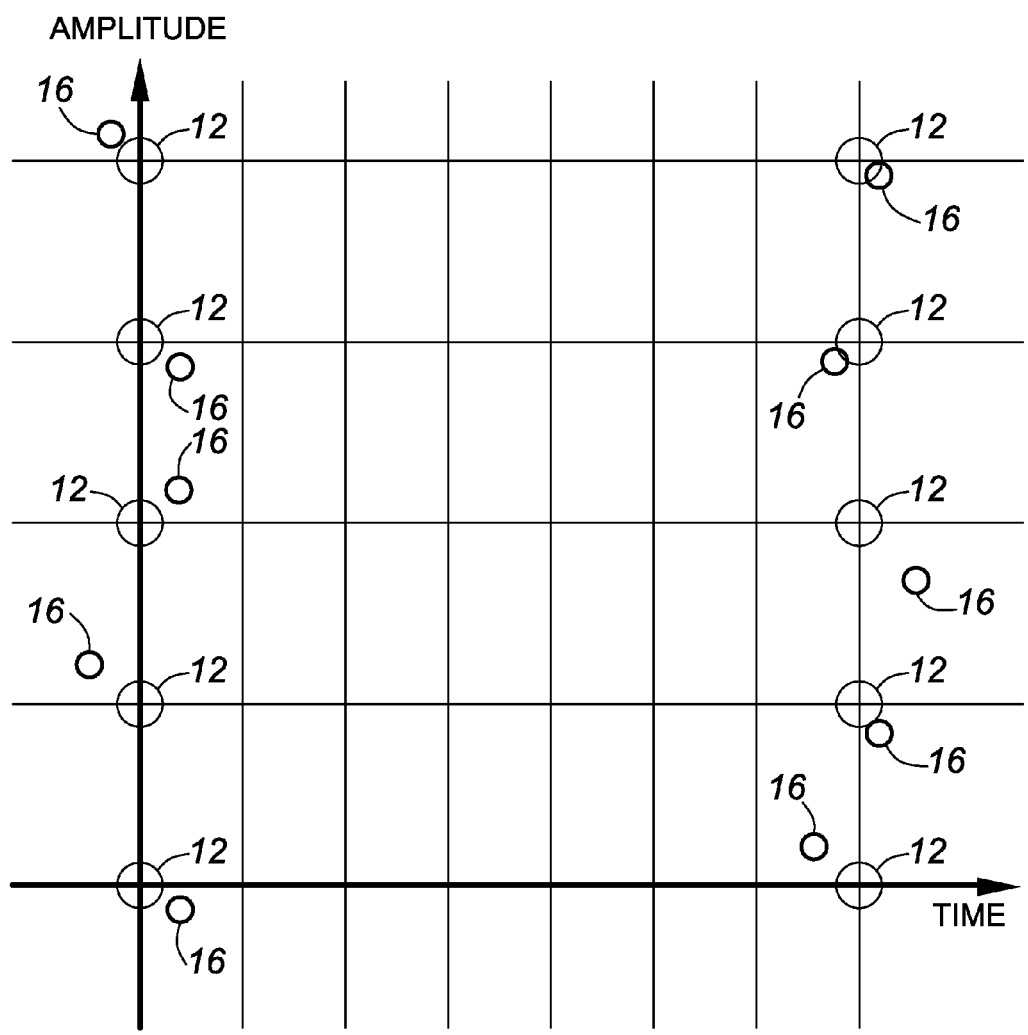
FIG. 4 illustrates the impact of both threshold and aperture timing errors.
Figure 5:
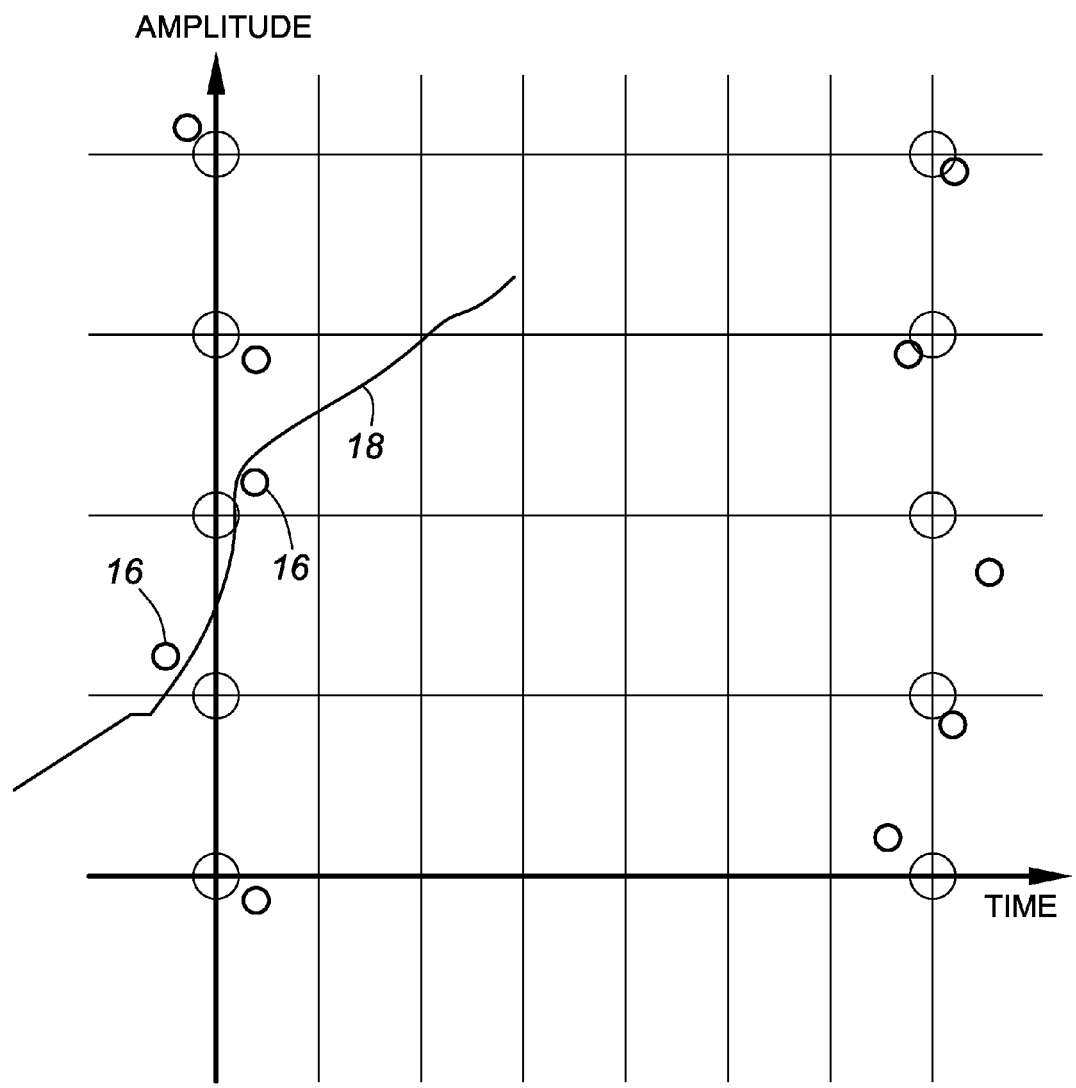
FIG. 5 illustrates an analog signal passing between the timing instants of two samplers.
Figure 6:
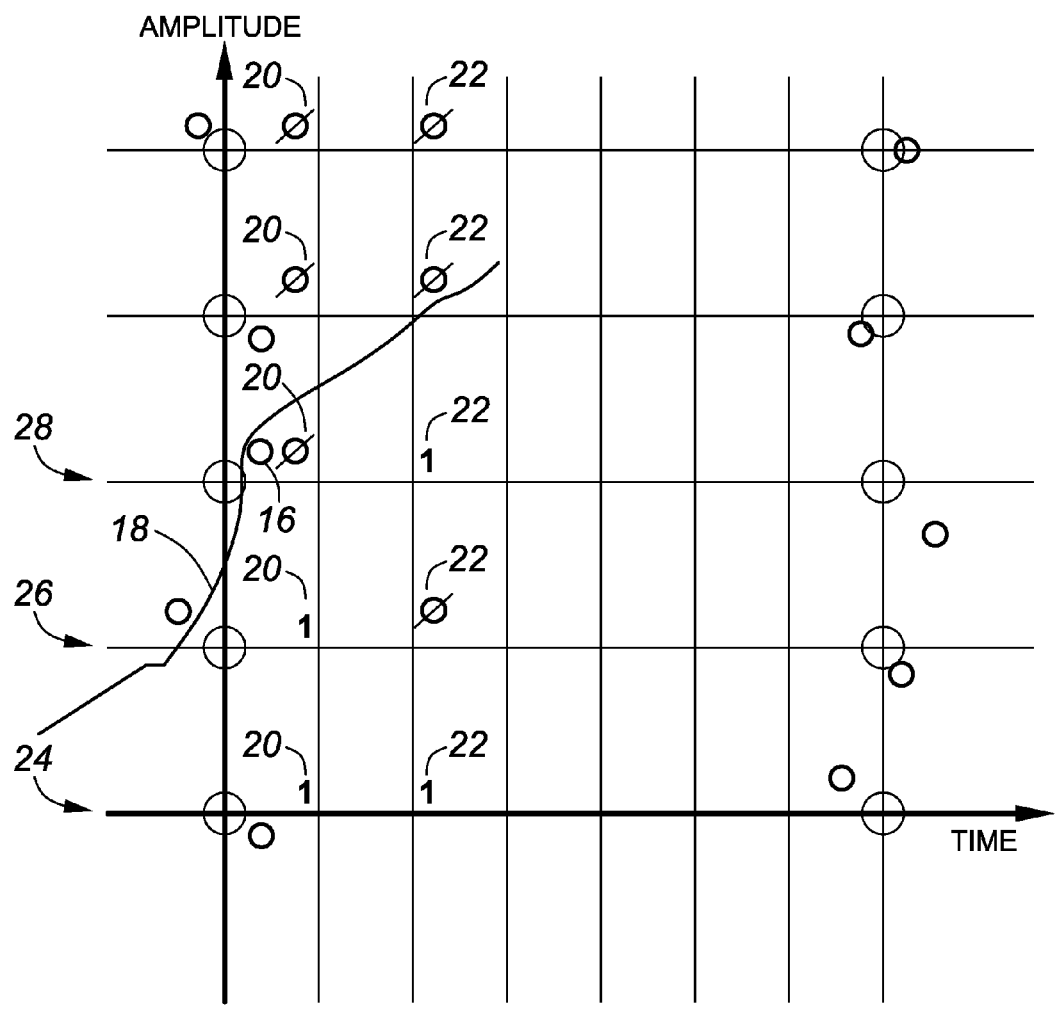
FIG. 6 illustrates the output of the individual samplers in the scenario of FIG. 5, showing occurrence of a "bubble".

Generally, the present disclosure provides a method of background calibration of aperture center errors in a data communication system. In an implementation, in response to detection of a low sampler output ("0") in between two high sampler outputs ("1"), the method includes: estimating or calculating a signal derivative of an ADC output signal at the time of the detected low output; and adjusting timing at a selected sampler based on the estimated or calculated signal derivative. In an example implementation, the method includes watching for bubbles in the thermometer code output, and estimating the first derivative of the signal at the time of the bubble, then estimating the sign of the errors. In an example implementation, the errors are used in a control loop to reduce the aperture center error.

In an example embodiment, the bubbles are removed rather than trying to compensate for their occurrence. In an example embodiment, aperture center errors are removed in the background, in order to remove the occurrence of "bubbles".

In an embodiment, the present disclosure provides a method of background calibration of aperture timing errors in a data communication system including an analog to digital converter (ADC) having a plurality of samplers, comprising: in response to detection of a low sampler output ("0") in between two high sampler outputs ("1"), the low and high sampler outputs being at the same sampler in the plurality of samplers: calculating a signal derivative of an ADC output signal at the time of the detected low output; and adjusting timing at a selected sampler based on the calculated signal derivative.

In an example embodiment, calculating the signal derivative comprises detecting a negative timing error; and adjusting the timing at the selected sampler comprises moving the timing later in time such that sampler timing occurs later than before the adjustment to compensate for the detected negative timing error.

In an example embodiment, calculating the signal derivative comprises detecting a positive timing error; and adjusting the timing at the selected sampler comprises moving the timing earlier in time such that sampler timing occurs earlier than before the adjustment to compensate for the detected positive timing error.

In an example embodiment, calculating the signal derivative comprises comparing an ADC output level at a current time sample with an ADC output level at a previous time sample.

In an example embodiment, the method further comprises: detecting the low sampler output in between the two high sampler outputs based on observation of a thermometer encoded sampler output.

In an example embodiment, adjusting the timing, or accounting for a timing error, at the selected sampler comprises a DSP interpolation to resample a waveform to provide equally timing spaced output samples. In an example embodiment, the DSP interpolation is performed using a map of ADC output level values and aperture timing error estimations.

In an example embodiment using DSP interpolation, the method further comprises: counting a number of aperture error events for each of the plurality of samplers; converting the aperture error count to an aperture error value in real time units; building a map of ADC output levels and their associated aperture timing error; and resampling, using the map and in the digital domain, a waveform corresponding to the ADC output signal using the real timing locations for each ADC output value.

In an embodiment, the present disclosure provides a computer-readable storage device storing statements and instructions for execution by a processor to perform a method of background calibration of aperture timing errors in a data communication system including an analog to digital converter (ADC) having a plurality of samplers, comprising: in response to detection of a low sampler output ("0") in between two high sampler outputs ("1"), the low and high sampler outputs being at the same sampler in the plurality of samplers: calculating a signal derivative of an ADC output signal at the time of the detected low output; and adjusting timing at a selected sampler based on the calculated signal derivative.

In an embodiment, the present disclosure provides a system for background calibration of aperture timing errors in a data communication system including an analog to digital converter (ADC) having a plurality of samplers, comprising: a signal processor configured to, in response to detection of a low sampler output ("0") in between two high sampler outputs ("1"), the low and high sampler outputs being at the same sampler in the plurality of samplers, calculate a signal derivative of an ADC output signal at the time of the detected low output; and a timing adjustment circuit configured to adjust timing at a selected sampler based on the calculated signal derivative.

In an example embodiment: the signal processor detects a negative timing error; and the timing adjustment circuit is configured to move the timing later in time such that sampler timing occurs later than before the adjustment to compensate for the detected negative timing error. In an example embodiment, the negative timing error is detected as: (Bubble[i]) AND (SignalDerivative[i]>0), where Bubble is defined as a low sampler output ("0") below a high sampler output ("1"), and wherein SignalDerivative[i]=ADCoutput[i]−ADCoutput[i−1].

In an example embodiment: the signal processor is configured to detect a positive timing error; and the timing adjustment circuit is configured to move the timing earlier in time such that sampler timing occurs earlier than before the adjustment to compensate for the detected positive timing error. In an example embodiment, the positive timing error is detected as: (Bubble[i]) AND (SignalDerivative[i]<0), where Bubble is defined as a low sampler output ("0") below a high sampler output ("1"), and wherein $$SignalDerivative[i]=ADCoutput[i]-ADCoutput[i-1].$$

In an example embodiment, the signal processor is configured to compare an ADC output level at a current time sample with an ADC output level at a previous time sample. In another example embodiment, the signal processor is configured to detect the low sampler output in between the two high sampler outputs based on observation of a thermometer encoded sampler output.

In an example embodiment, the system further includes a digital signal processor (DSP), the signal processor and the timing adjustment circuit being integral with the DSP, the DSP being configured to adjust the timing at the selected sampler using DSP interpolation to resample a waveform to provide equally timing spaced output samples. In an example embodiment, the DSP is configured to perform the DSP interpolation using a map of ADC output level values and aperture timing error estimations. In an example embodiment, the DSP is configured to: count a number of aperture error events for each of the plurality of samplers; convert the aperture error count to an aperture error value in real time units; build a map of ADC output levels and their associated aperture timing error; and resample, using the map and in the digital domain, a waveform corresponding to the ADC output signal using the real timing locations for each ADC output value.

Other aspects and features of the present disclosure will become apparent to those ordinarily skilled in the art upon review of the following description of specific embodiments in conjunction with the accompanying figures.

A method of background calibration of comparator aperture timing errors in a flash ADC according to an embodiment of the present disclosure will now be described.

A negative timing error is detected as $$(\text{Bubble}[i]) \text{ AND } (\text{SignalDerivative}[i]>0) \quad \text{Equation 4}$$

where Bubble is defined as a 0 "below" a 1. Note that "below" means the sampler has a relatively lower threshold. The signal derivative is detected by comparing the current time sample to the previous time sample, or $$SignalDerivative[i]=ADCoutput[i]-ADCoutput[i-1] \quad \text{Equation 5}$$

A "thermometer code" can be used to represent outputs of an ADC. Using a thermometer code of N bits, there is one bit used for each discrete possible value. For example, an 8-bit code can be used to represent the numbers 0-8, where: 0 is represented by 00000000; 3 is represented by 11100000; 5 is represented by 11111000; and 8 is represented by 11111111. A "bubble" is easily identified as an error in a thermometer code output, since a thermometer code by definition has at most one transition from 1s to 0s.

It is worthwhile to distinguish between: the total ADC output, which represents the magnitude of the input signal and where the signal derivative is detected; and the sampler set thermometer encoded output, where the bubbles are detected. Note that the ADC output and the sampler thermometer encoded output can be the same, but used differently.

Figure 7:
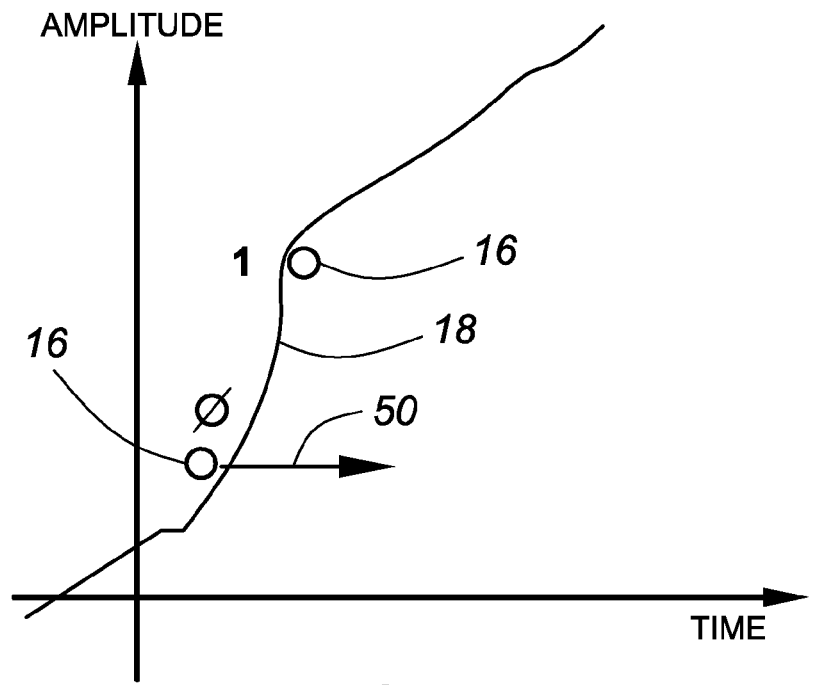
FIG. 7 illustrates detection and correction of negative timing error according to an embodiment of the present disclosure.
Figure 8:
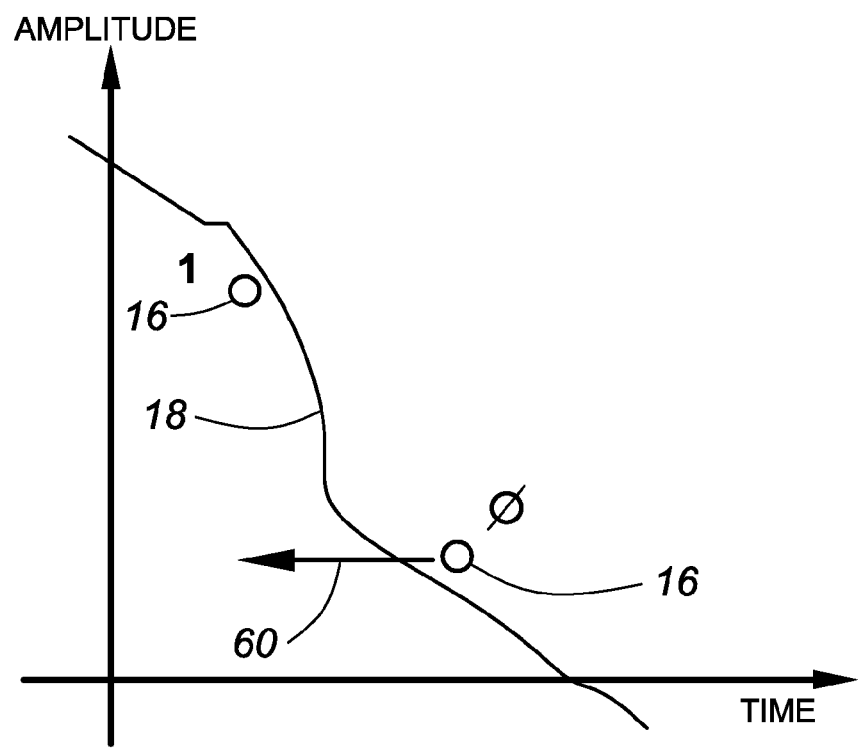
FIG. 8 illustrates detection and correction of a positive timing error according to an embodiment of the present disclosure.

FIGS. 7 and 8 illustrate the detection and correction of different types of timing errors according to an embodiment of the present disclosure. Because the sampler output is digital, it is possible to observe the output and simply look for the presence of the bubble. Embodiments of the present disclosure look for two kinds of bubbles, which are shown in FIGS. 7 and 8. The first kind of bubble, shown in FIG. 7, occurs when one presumes that the analog signal 18 is travelling in the upward direction in time, and therefore there is a movement from a low value to a higher value. Upon detection of a bubble, and knowing that the analog signal 18 is travelling in the upward direction, a method according to an embodiment of the present disclosure pushes the error to the right. This is shown by the arrow 50 in FIG. 7, which represents the direction in which a method according to an embodiment of the present disclosure moves the timing of the bottom sampler.

In FIG. 7, the horizontal dimension is time and the vertical dimension is amplitude. When the analog signal 18 appears as shown in FIG. 7, between the measured values 16 which represent the amplitude and aperture timing of two consecutive comparators, a bubble condition occurs since a 0 is below a 1. In this case, the method according to an embodiment of the present disclosure detects a negative timing error and moves the timing of the lower sampler forward in time by some small amount.

A positive timing error is detected as $$(\text{Bubble}[i]) \text{ AND } (\text{SignalDerivative}[i]<0) \qquad \text{Equation 6}$$

FIG. 8 illustrates detection and correction of a positive timing error according to an embodiment of the present disclosure. In FIG. 8, the horizontal dimension is time and the vertical dimension is amplitude. When the analog signal 18 appears as shown between the measured values 16, a bubble condition occurs since a 0 is below a 1. In this case, the method according to an embodiment of the present disclosure detects a positive timing error and will move the timing of the lower sampler earlier in time by a small amount. This is shown by the arrow 60 in FIG. 8, which represents the direction in which a method according to an embodiment of the present disclosure moves the timing of the bottom sampler.

According to embodiments of the present disclosure, when the direction of the signal is known, the timing of the comparator gate is moved based on the detected direction of the signal, which can be calculated based on a signal derivative. Therefore, for a detected bubble, it is desirable to know if the 0 needs to be moved to the right or to the left. In FIG. 7, it is desirable to move the comparator that gave a 0 output to the right, and in FIG. 8 it is desirable to move it to the left, to correct the aperture timing errors in the background.

Figure 9:
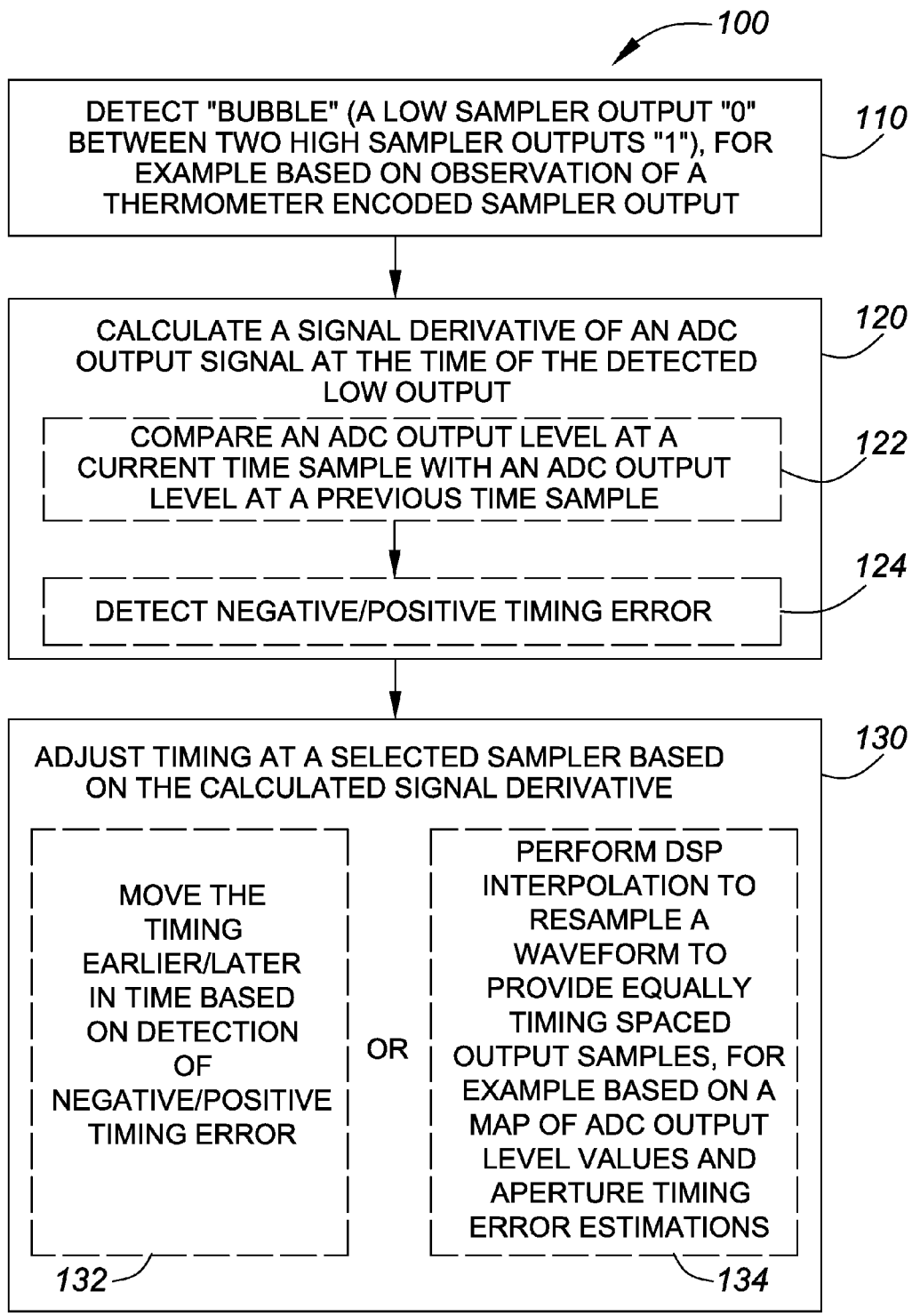
FIG. 9 is a flowchart illustrating a method of background calibration error of aperture center errors in a data communication system according to an embodiment of the present disclosure.

FIG. 9 is a flowchart illustrating a method 100 of background calibration error of aperture center errors in a data communication system according to an embodiment of the present disclosure. The method includes estimating or calculating a signal derivative of an ADC output signal at the time of the detected low output (120); and adjusting timing at a selected sampler based on the estimated or calculated signal derivative (130). The calculating is performed in response to detection of a low sampler output ("0") in between two high sampler outputs ("1"), the low and high sampler outputs being at the same sampler in the plurality of samplers. In an embodiment, the method includes optional step 110 of detecting the low sampler output in between the two high sampler outputs, for example based on observation of a thermometer encoded sampler output.

In an embodiment, the step 130 comprises moving the timing earlier/later in time based on detection of negative/positive timing error (132), in which case the actual timing of a sampler is moved, for example by adjusting the timing of the sampler's clock. In an alternative embodiment, the step 130 includes performing DSP interpolation to resample a waveform to provide equally timing spaced output samples, for example based on a map of ADC output level values and aperture timing error estimations (134), which is effectively changing the timing in the digital domain. In an example embodiment in which step 134 is performed, the analog timing of the sampler is left alone, but the DSP interpolates the output waveform such that it computes what the signal is at the ideal sampler clock time. In example embodiments, either step 132 or step 134 is performed, but they are not performed together.

In an example embodiment, calculating the signal derivative (120) comprises comparing an ADC output level at a current time sample with an ADC output level at a previous time sample (122).

In an example embodiment, calculating the signal derivative (120) comprises detecting a negative timing error (124). In such an example embodiment, adjusting the timing at the selected sampler (130) comprises moving the timing later in time such that sampler timing occurs later than before the adjustment to compensate for the detected negative timing error (132).

In another example embodiment, calculating the signal derivative (120) comprises detecting a positive timing error (124). In such an example embodiment, adjusting the timing at the selected sampler (130) comprises moving the timing earlier in time such that sampler timing occurs earlier than before the adjustment to compensate for the detected positive timing error (132).

In an example embodiment, adjusting the timing at the selected sampler (130) comprises a digital signal processor (DSP) interpolation to resample a waveform to provide equally timing spaced output samples (134). In an example embodiment, the DSP interpolation is performed using a map of ADC output level values and aperture timing error estimations.

In an example embodiment, the DSP method further comprises: counting a number of aperture error events for each of the plurality of samplers; converting the aperture error count to an aperture error value in real time units; building a map of ADC output levels and their associated aperture timing error; and resampling, using the map and in the digital domain, a waveform corresponding to the ADC output signal using the real timing locations for each ADC output value. Such an example embodiment will be discussed in further detail below. This method is only used for the DSP method case, when step 134 is performed instead of step 132.

Figure 10:
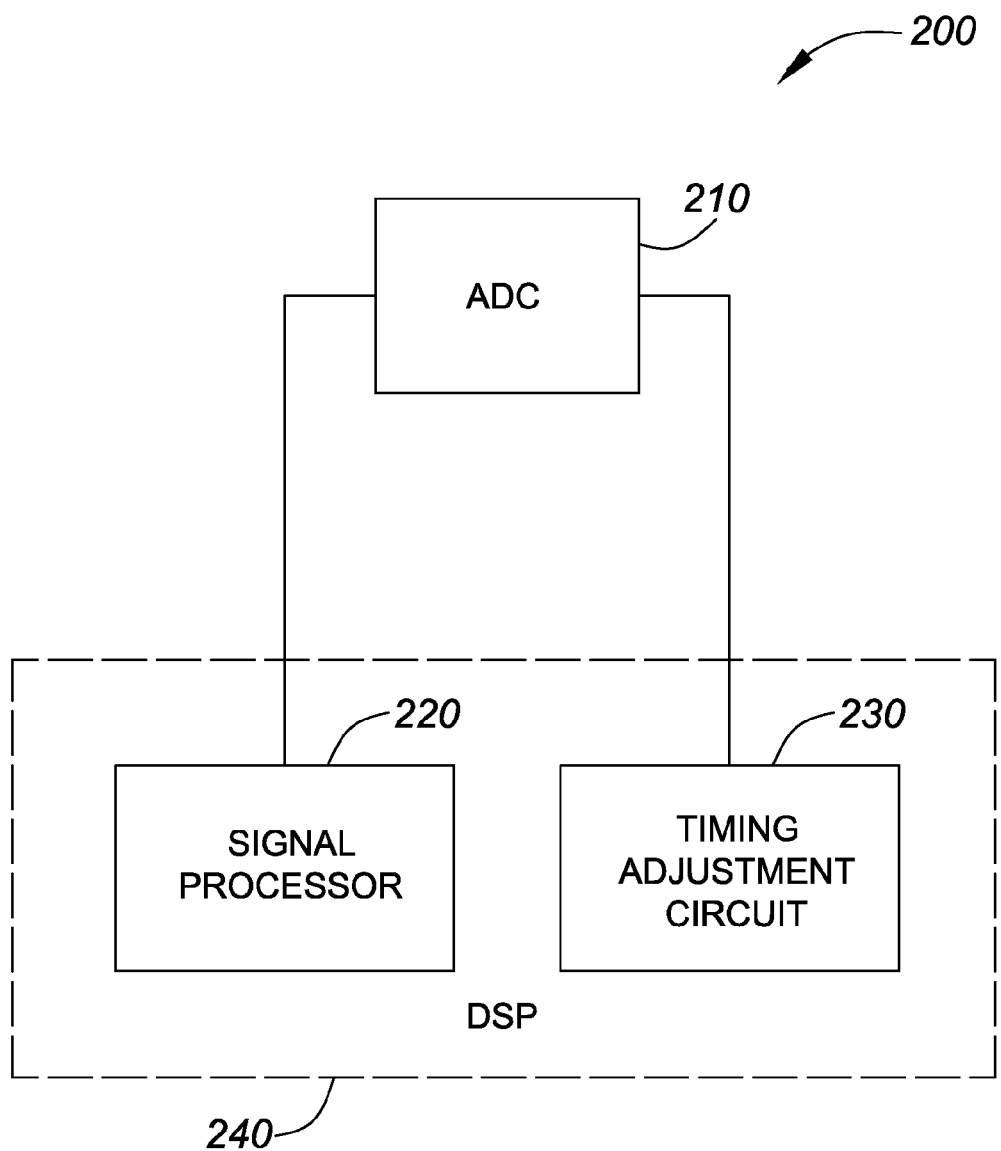
FIG. 10 is a block diagram illustrating a system for background calibration of aperture timing errors in a data communication system including an ADC according to an embodiment of the present disclosure.

FIG. 10 is a block diagram illustrating a system 200 for background calibration of aperture timing errors in a data communication system including an ADC 210 according to an embodiment of the present disclosure. The system includes a signal processor 220, configured to perform step 120 of FIG. 9, and in example embodiments to perform related steps and sub-steps as described an illustrated herein. The system also includes a timing adjustment circuit 230, configured to perform step 130, and in example embodiments to perform related steps and sub-steps as described and illustrated herein. In an embodiment, the system further includes a DSP 240 configured to perform step 134, and in example embodiments to perform related steps and sub-steps as described and illustrated herein. In an example embodiment, the DSP 240 comprises the signal processor 220 and the timing adjustment circuit 230; alternatively, the signal processor 220 and the timing adjustment circuit 230 are integral with the DSP.

Figure 11:
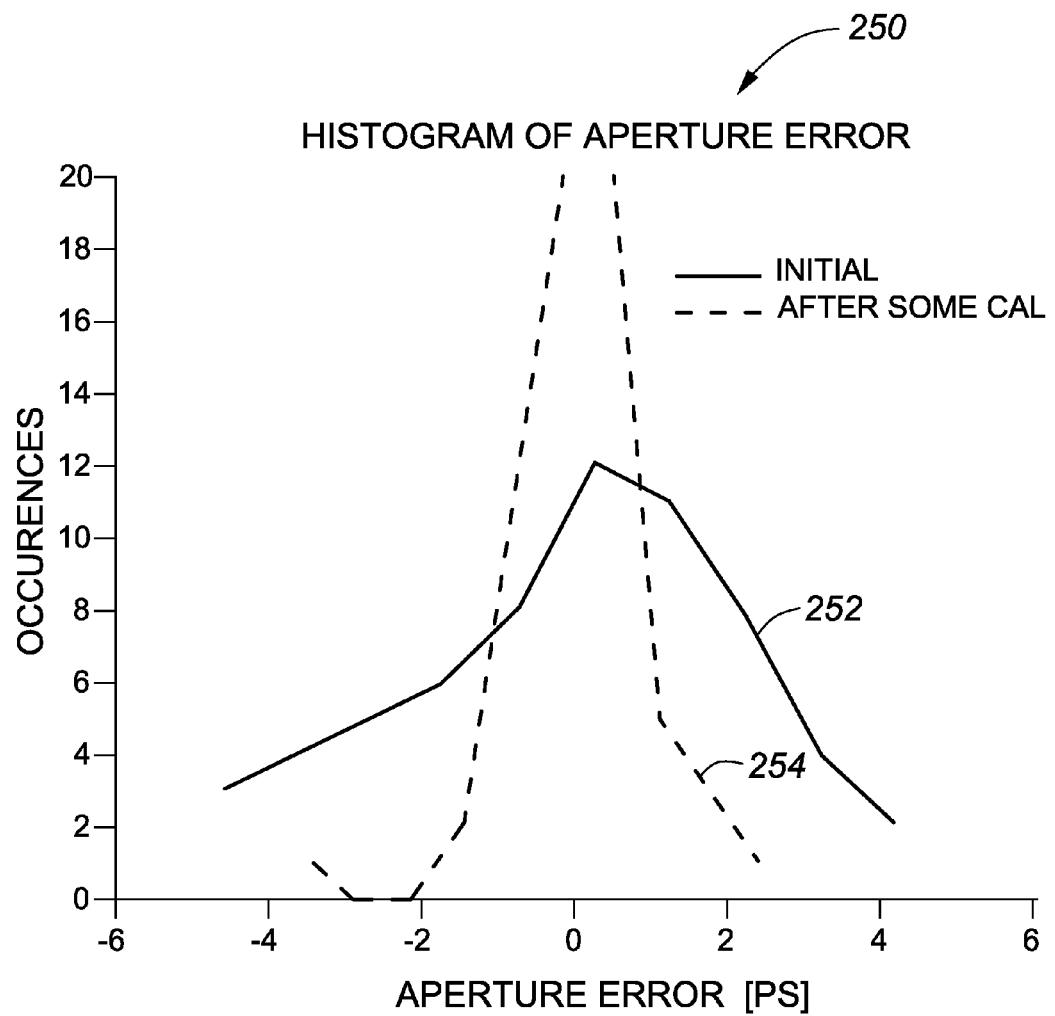
FIG. 11 is a graph illustrating a comparison of histograms of aperture timing error before and after using a method according to an embodiment of the present disclosure.

FIG. 11 is a graph 250 illustrating a comparison of histograms of aperture timing error before and after using a method according to an embodiment of the present disclosure. FIG. 11 illustrates an example in which the aperture timing error histogram 252 before using a method according to an embodiment of the present disclosure shows about 12 occurrences of an aperture error of zero, and many occurrences of aperture errors between −4 and +4 ps. In contrast, the aperture timing error histogram 254 after using a method according to an embodiment of the present disclosure shows over 20 occurrences of an aperture error of zero, and a significant decrease of errors between −4 and +4 ps, particularly in the range of −2 to +2 ps.

A method according to an embodiment of the present disclosure as described above shows the aperture timing of the samplers being moved as the method detects bubbles, to force the aperture times to all occur at the same instant. This is essentially an analog technique.

In another embodiment, rather than move the analog sampler aperture times, DSP interpolation is performed, such as described generally with respect to step 134 in FIG. 9. To do this, it is recognized that aperture timing errors mean that each possible ADC output value actually occurs at a time other than the ideal sample time.

Figure 12:
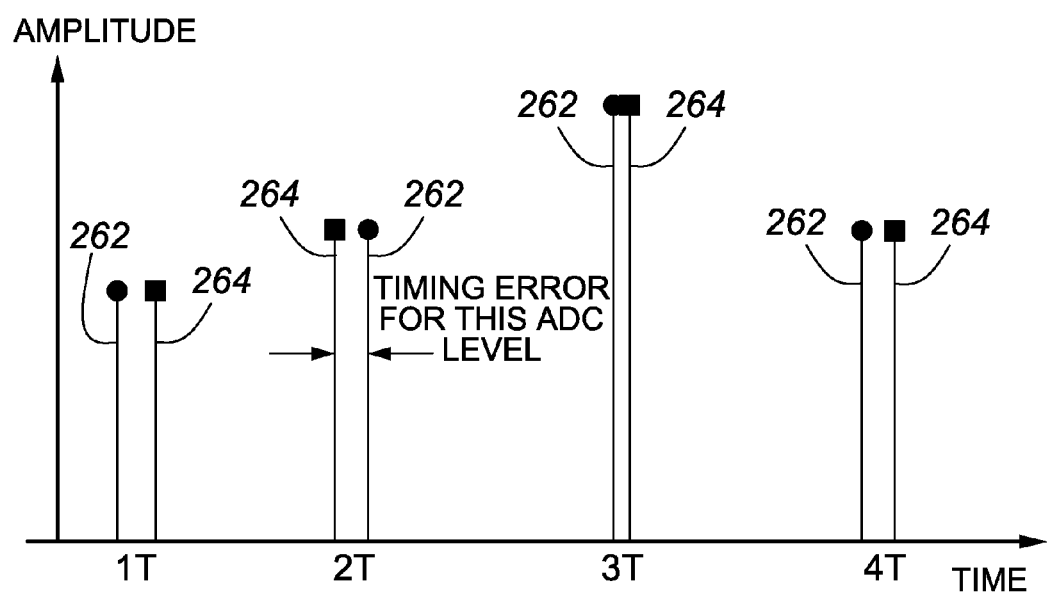
FIG. 12 is a bar graph illustrating normal ADC output timing with and without aperture timing errors for each ADC output level.

FIG. 12 is a bar graph illustrating normal ADC output timing with and without aperture timing errors for each ADC output level. For the ideal outputs, without errors, each sample occurs at an integer multiple of the sampling period. The bars 264 with the round ends show the ideal sampling instant, and the bars 152 with the square ends show the actual, or measured, timing instant. Each ADC output level includes a pair of bars 152 and 154. In the example embodiment of FIG. 12, for each ADC output level, the timing error is defined as the difference between the location of the pair of ideal and actual sampling instant bars 152 and 154.

With the timing error for each ADC output level estimated as described above, this information can be used to interpolate, or digitally re-sample the waveform back to the desired timing instants.

A method according to an embodiment of the present disclosure involving DSP interpolation can be described as follows:

1. Detect positive and negative aperture errors as described above, except do not move the analog sampler aperture timing; instead, count the number of aperture error events for each sampler. So, for each ADC output code, an associated aperture error count, or C(ADCcode), is obtained or calculated.

2. Multiply the C(ADCcode) counts by K(ADCcode,C(ADCcode)), to convert the aperture error count to the aperture error value in real time units. In an embodiment, K is computed offline by simulating various aperture error amounts and measuring the resulting number of error events for a given time period, for each ADC output code.

3. Build a map of ADC output levels and their associated aperture timing error, Ae.

$$Ae(\text{ADCcode}) = K(\text{ADCcode}, C(\text{ADCcode})) * C(\text{ADCcode}) \quad \text{Equation 7}$$

4. Using this map, in the digital domain, resample the waveform using the real timing locations for each ADC output value.

As an illustrative example, in the Matlab programming language, this method could be expressed as $$\text{ResampledOutput} = \text{interp1}(0:T:\text{endTime} + Ae(\text{ADCoutput}), \text{ADCcodes}, 0:T:\text{endTime}); \quad \text{Equation 8}$$

where ADCoutput is the signal waveform out of the ADC, T is the ideal sampling period, and ResampledOutput is the ADC output signal re-timed so that all samples occur at multiples of the ideal sampling period, or, kT.

Note that embodiments of the present disclosure do not assume that Matlab will be used on chip; rather, Equation 8 is used to express what interpolation is occurring and how the on chip values will be used.

According to an embodiment of the present disclosure, knowing whether the signal is travelling up or down can make an important difference; however all we have is the ADC itself to indicate if the signal is increasing or decreasing. According to an embodiment of the present disclosure, the signal derivative is observed across two major samples, which in an example embodiment is two of the interleaves. In an example embodiment, as shown in FIG. 7, only two of the comparators are chosen for a given leaf, even though there is whole other column of comparators for the signal derivatives. In an example embodiment, the last column signal is compared to the current column signal to determine if the signal is travelling up or down. While it is possible that this comparison can give incorrect results because of the potential bubble, it is still on average providing an accurate indication of whether the signal is going up or down, and that is described with the signal derivative.

Embodiments of the present disclosure enable lower power ADCs and/or higher performance ADCs. The ADC is a fundamental object of signal processing in many communications products. Embodiments of the present disclosure provide a competitive advantage in power or performance, or both.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art without departing from the scope, which is defined solely by the claims appended hereto.

What is claimed is:

1. A method of background calibration of aperture timing errors in a data communication system including an analog to digital converter (ADC) having a plurality of samplers, comprising:
in response to detection of a low sampler output ("0") in between two high sampler outputs ("1"), the low and high sampler outputs being at the same sampler in the plurality of samplers:
determining a direction of an ADC output signal at the time of the detected low output; and
adjusting timing at a selected sampler based on the determined signal direction.

2. The method of claim 1 wherein:
determining the signal direction comprises detecting a negative timing error; and
adjusting the timing at the selected sampler comprises moving the timing later in time such that sampler timing occurs later than before the adjustment to compensate for the detected negative timing error.

3. The method of claim 2 wherein the negative timing error is detected as:

$(Bubble[i])$ AND $(SignalDerivative[i]>0);$ where Bubble is defined as a low sampler output ("0") below a high sampler output ("1"), and wherein $SignalDerivative[i]=ADCoutput[i]-ADCoutput[i-1].$ 4. The method of claim 1 wherein:
determining the signal direction comprises detecting a positive timing error; and
adjusting the timing at the selected sampler comprises moving the timing earlier in time such that sampler timing occurs earlier than before the adjustment to compensate for the detected positive timing error.

5. The method of claim 4 wherein the positive timing error is detected as:

$(Bubble[i])$ AND $(SignalDerivative[i]<0);$ where Bubble is defined as a low sampler output ("0") below a high sampler output ("1"), and wherein $SignalDerivative[i]=ADCoutput[i]-ADCoutput[i-1].$ 6. The method of claim 1 wherein:
determining the signal direction comprises comparing an ADC output level at a current time sample with an ADC output level at a previous time sample.

7. The method of claim 1 further comprising:
detecting the low sampler output in between the two high sampler outputs based on observation of a thermometer encoded sampler output.

8. The method of claim 1 wherein:
adjusting the timing at the selected sampler comprises a digital signal processor (DSP) interpolation to resample a waveform to provide equally timing spaced output samples.

9. The method of claim 6 wherein the DSP interpolation is performed using a map of ADC output level values and aperture timing error estimations.

10. The method of claim 6 further comprising:
counting a number of aperture error events for each of the plurality of samplers;
converting the aperture error count to an aperture error value in real time units;
building a map of ADC output levels and their associated aperture timing error; and
resampling, using the map and in the digital domain, a waveform corresponding to the ADC output signal using the real timing locations for each ADC output value.

11. A computer-readable storage device storing statements and instructions for execution by a processor to perform a method of background calibration of aperture timing errors in a data communication system including an analog to digital converter (ADC) having a plurality of samplers, comprising:
in response to detection of a low sampler output ("0") in between two high sampler outputs ("1"), the low and high sampler outputs being at the same sampler in the plurality of samplers:
determining a signal direction of an ADC output signal at the time of the detected low output; and
adjusting timing at a selected sampler based on the determined signal direction.

12. A system for background calibration of aperture timing errors in a data communication system including an analog to digital converter (ADC) having a plurality of samplers, comprising:
a signal processor configured to, in response to detection of a low sampler output ("0") in between two high sampler outputs ("1"), the low and high sampler outputs being at the same sampler in the plurality of samplers, determine a signal direction of an ADC output signal at the time of the detected low output; and
a timing adjustment circuit configured to adjust timing at a selected sampler based on the determined signal direction.

13. The system of claim 12 wherein:
the signal processor detects a negative timing error; and
the timing adjustment circuit is configured to move the timing later in time such that sampler timing occurs later than before the adjustment to compensate for the detected negative timing error.

14. The system of claim 13 wherein the negative timing error is detected as:

$(Bubble[i])$ AND $(SignalDerivative[i]>0);$ where Bubble is defined as a low sampler output ("0") below a high sampler output ("1"), and wherein $SignalDerivative[i]=ADCoutput[i]-ADCoutput[i-1].$ 15. The system of claim 12 wherein:
the signal processor is configured to detect a positive timing error; and
the timing adjustment circuit is configured to move the timing earlier in time such that sampler timing occurs earlier than before the adjustment to compensate for the detected positive timing error.

16. The system of claim 15 wherein the positive timing error is detected as:

$(Bubble[i])$ AND $(SignalDerivative[i]<0);$ where Bubble is defined as a low sampler output ("0") below a high sampler output ("1"), and wherein $SignalDerivative[i]=ADCoutput[i]-ADCoutput[i-1].$ 17. The system of claim 12 wherein:
the signal processor is configured to compare an ADC output level at a current time sample with an ADC output level at a previous time sample.

18. The system of claim 12 wherein:
the signal processor is configured to detect the low sampler output in between the two high sampler outputs based on observation of a thermometer encoded sampler output.

19. The system of claim 12 further comprising:
a digital signal processor (DSP), the signal processor and the timing adjustment circuit being integral with the DSP, the DSP being configured to adjust the timing at the selected sampler using DSP interpolation to resample a waveform to provide equally timing spaced output samples.

20. The system of claim 19 wherein the DSP is configured to perform the DSP interpolation using a map of ADC output level values and aperture timing error estimations.

21. The system of claim 19 wherein the DSP is configured to:
count a number of aperture error events for each of the plurality of samplers;
convert the aperture error count to an aperture error value in real time units;
build a map of ADC output levels and their associated aperture timing error; and
resample, using the map and in the digital domain, a waveform corresponding to the ADC output signal using the real timing locations for each ADC output value.

* * * * *